United States Patent
Ding et al.

(10) Patent No.: US 10,872,223 B2
(45) Date of Patent: Dec. 22, 2020

(54) FINGERPRINT RECOGNIZER, FINGERPRINT RECOGNITION METHOD, LIGHT EMITTER DEVICE, OPTICAL SENSOR, AND DISPLAY DEVICE

(71) Applicant: BOE TECHNOLOGY GROUP CO., LTD., Beijing (CN)

(72) Inventors: Xiaoliang Ding, Beijing (CN);
Haisheng Wang, Beijing (CN);
Yingming Liu, Beijing (CN);
Pengpeng Wang, Beijing (CN); Wei Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/323,972

(22) PCT Filed: Apr. 25, 2018

(86) PCT No.: PCT/CN2018/084460
§ 371 (c)(1),
(2) Date: Feb. 7, 2019

(87) PCT Pub. No.: WO2018/205835
PCT Pub. Date: Nov. 15, 2018

(65) Prior Publication Data
US 2019/0180074 A1 Jun. 13, 2019

(30) Foreign Application Priority Data
May 11, 2017 (CN) .......................... 2017 1 0330780

(51) Int. Cl.
*G06K 9/00* (2006.01)
*G06F 3/041* (2006.01)
(Continued)

(52) U.S. Cl.
CPC .............. *G06K 9/0004* (2013.01); *G01L 1/18* (2013.01); *G01L 1/2293* (2013.01);
(Continued)

(58) Field of Classification Search
CPC ....... G06K 9/0004; G01L 1/18; G01L 1/2293; G06F 3/0412; G06F 3/0414;
(Continued)

(56) References Cited

U.S. PATENT DOCUMENTS

2010/0301741 A1 12/2010 Kim et al.
2011/0273396 A1* 11/2011 Chung, II ............... G06F 3/041
 345/174
(Continued)

FOREIGN PATENT DOCUMENTS

CN 1518133 A 8/2004
CN 101901876 A 12/2010
(Continued)

OTHER PUBLICATIONS

First Chinese Office Action dated Apr. 19, 2019.
(Continued)

*Primary Examiner* — Stephen G Sherman
(74) *Attorney, Agent, or Firm* — Dilworth & Barrese, LLP.; Michael J. Musella, Esq.

(57) ABSTRACT

A fingerprint recognizer, a fingerprint recognition method, a light emitter device, an optical sensor and a display device are provided. The fingerprint recognizer includes a pressure detector unit, a light emitter unit, a light sensor unit, and a fingerprint analyzer unit. The pressure detector unit is configured to detect the strength at which a finger presses a display screen, and send a signal to the light emitter unit according to the strength. The light emitter unit is configured to emit a light signal under the control of the signal of the pressure detector unit. The light sensor unit is configured to
(Continued)

receive a light-reflection signal formed by the light signal reflected by the finger, convert the light-reflection signal into an electrical signal and output the electrical signal to the fingerprint analyzer unit. The fingerprint analyzer unit is configured to determine fingerprint information according to the received electrical signal.

17 Claims, 4 Drawing Sheets

(51) Int. Cl.
*G01L 1/18* (2006.01)
*H01L 27/32* (2006.01)
*G01L 1/22* (2006.01)
*H01L 31/10* (2006.01)
*H01L 51/50* (2006.01)

(52) U.S. Cl.
CPC .......... *G06F 3/0412* (2013.01); *G06F 3/0414* (2013.01); *H01L 27/323* (2013.01); *H01L 27/3225* (2013.01); *H01L 31/10* (2013.01); *H01L 51/5012* (2013.01)

(58) Field of Classification Search
CPC ... H01L 27/323; H01L 27/3225; H01L 31/10; H01L 51/5012
See application file for complete search history.

(56) References Cited

U.S. PATENT DOCUMENTS

| | | | |
|---|---|---|---|
| 2018/0046306 A1* | 2/2018 | Lin | ............ H01L 51/5221 |
| 2018/0211083 A1 | 7/2018 | Du et al. | |
| 2019/0180074 A1 | 6/2019 | Ding et al. | |

FOREIGN PATENT DOCUMENTS

| | | |
|---|---|---|
| CN | 203300351 U | 11/2013 |
| CN | 104217480 A | 12/2014 |
| CN | 204069106 U | 12/2014 |
| CN | 104537365 A | 4/2015 |
| CN | 104573649 A | 4/2015 |
| CN | 105426040 A | 4/2015 |
| CN | 105809141 A | 7/2016 |
| CN | 106384101 A | 2/2017 |
| CN | 107122759 A | 9/2017 |

OTHER PUBLICATIONS

Second Chinese Office Action dated Jul. 23, 2019.
International Search Report and Written Opinion dated Jul. 23, 2018.
Global Initiave in living-fingerprint detection method, 51 Touch Qinghai Science and Technology, 2016, vol. No. 2, pp. 70-72.

* cited by examiner

FINGERPRINT RECOGNIZER, FINGERPRINT RECOGNITION METHOD, LIGHT EMITTER DEVICE, OPTICAL SENSOR, AND DISPLAY DEVICE

CROSS REFERENCE TO RELATED APPLICATIONS

The application claims priority to Chinese patent application No. 201710330780.X filed on May 11, 2017, the entire disclosure of which is incorporated herein by reference as part of the present application.

TECHNICAL FIELD

Embodiments of the present disclosure relate to a fingerprint recognizer, a fingerprint recognition method, a light emitter device, an optical sensor and a display device.

BACKGROUND

With the rapid development of related technologies, mobile products with biometric recognition functions have gradually entered people's life and work in recent years. The fingerprint recognition technologies have attracted wide attentions because of unique identity of a fingerprint.

The fingerprint recognition technologies can be implemented by various sensors, and optical sensors are common sensors in the fingerprint recognition technologies.

SUMMARY

Embodiments of the present disclosure provide a fingerprint recognizer, a fingerprint recognition method, a light emitter device, an optical sensor and a display device.

At least one embodiment of the present disclosure provides a fingerprint recognizer, which includes a pressure detector unit, a light emitter unit, a light sensor unit and a fingerprint analyzer unit. The pressure detector unit is configured to detect a strength at which a finger presses a display screen of the fingerprint recognizer, and to send a signal to the light emitter unit according to the strength; the light emitter unit is configured to emit a light signal under control of the signal; the light sensor unit is configured to receive a light-reflection signal formed by the light signal reflected by the finger, to convert the light-reflection signal into an electrical signal, and to output the electrical signal to the fingerprint analyzer unit; the fingerprint analyzer unit is configured to determine fingerprint information according to the electrical signal received by the fingerprint analyzer unit.

At least one embodiment of the present disclosure further provides a fingerprint recognition method, which includes: by a pressure detector unit, detecting strength at which a finger presses a display screen and sending a signal to a light emitter unit according to the strength; by the light emitter unit, emitting a light signal under control of the signal; by a light sensor unit, receiving a light-reflection signal formed by the light signal reflected by the finger, converting the light-reflection signal into an electrical signal, and outputting the electrical signal to a fingerprint analyzer unit; and by the fingerprint analyzer unit, determining fingerprint information according to the electrical signal received by the fingerprint analyzer unit.

At least one embodiment of the present disclosure further provides a light emitter device, which includes: a light emitter unit and a piezoresistor. The light emitter unit includes an anode, a cathode and an light-emitting layer between the anode and the cathode; the piezoresistor includes a first electrode, a second electrode and a pressure sensitive material between the first electrode and the second electrode, the second electrode of the piezoresistor electrically connects the anode of the light emitter unit, and a current passing through the light emitter unit is under control of a current passing through the piezoresistor.

At least one embodiment of the present disclosure further provides an optical sensor, which includes the above-mentioned light emitter device and further includes a light sensor unit. The light emitter device is configured to emit a light signal; the light sensor unit is configured to detect a light-reflection signal formed by the light signal that is reflected, and the light signal is outputted by the light emitter device.

At least one embodiment of the present disclosure further provides a display device, which includes the above-mentioned fingerprint recognizer, the above-mentioned light emitter device, or the above-mentioned optical sensor.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
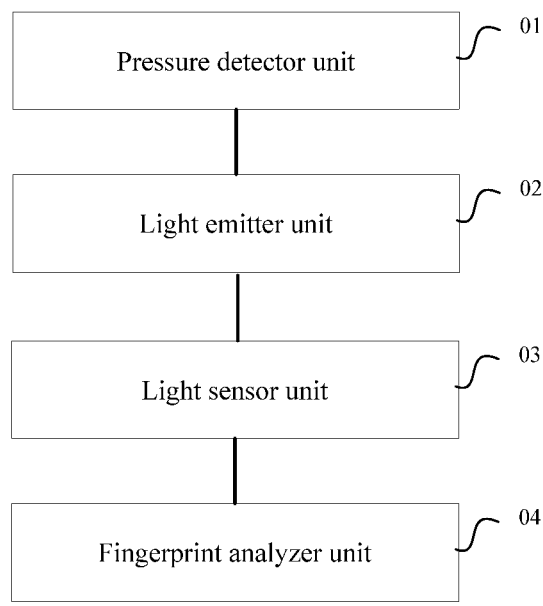
FIG. 1 is a schematic diagram of a fingerprint recognizer in at least one embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Steps as illustrated in the flow chart in the accompany drawings may be executed by a computer system provided with, for example, a set of computer executable instructions. Moreover, although a logical order is illustrated in the flow chart, but the steps as illustrated in or as described by the flow chart may be executed in an order different from the order here in some cases.

In research, the inventors of the present disclosure have noticed that, the optical fingerprint recognizers of current display terminals are mostly integrated on the touch control boards (for example, on home keys) in the non-display regions of the display terminals. However, the area of the touch control board in the non-display region is limited, and the existence of a mechanical key lowers the screen-to-body ratio of the display terminal and increases the manufacturing cost of the display terminal.

At least one embodiment of the present disclosure provides a fingerprint recognizer, which includes a pressure detector unit, a light emitter unit, a light sensor unit and a fingerprint analyzer unit. The pressure detector unit is configured to detect a strength at which a finger presses a display screen of the fingerprint recognizer, and to send a signal to the light emitter unit according to the strength; the light emitter unit is configured to emit a light signal under control of the signal; the light sensor unit is configured to receive a light-reflection signal formed by the light signal after the light signal is reflected by the finger, to convert the light-reflection signal into an electrical signal, and to output the electrical signal to the fingerprint analyzer unit; the fingerprint analyzer unit is configured to determine fingerprint information according to the electrical signal received by the fingerprint analyzer unit. The fingerprint recognizer realizes a fingerprint recognition function at the display region of the display screen. In some embodiments, for example, a plurality of fingerprints are obtained through changing the pressing strength of the finger, and data of a fingerprint-pressing-habit of a user is obtained according to the fingerprints, such that the reliability of the fingerprint recognition is improved.

For example, the display screen of the fingerprint recognizer includes a display region and a periphery region outside the display region, the display region includes a plurality of opening regions and a non-opening region which surrounds the plurality of opening regions, and all the pressure detector unit, the light emitter unit and the light sensor unit are located in the display region.

For example, as illustrated in FIG. 1, at least one embodiment of the present disclosure provides the fingerprint recognizer, which includes the pressure detector unit 01, the light emitter unit 02, the light sensor unit 03 and the fingerprint analyzer unit 04.

The pressure detector unit 01 is configured to detect the strength at which the finger presses the display screen of the fingerprint recognizer, and to send different signals respectively relevant to different strengths to the light emitter unit 02 according to the change of the strength.

The light emitter unit 02 is configured to emit light signals under the control of the different signals sent by the pressure detector unit 01, and intensities of the light signals are changed along with the change of the different signals. For example, the larger the strength at which the finger presses the display screen, the larger the intensity of the light signal emitted by the light emitter unit 02.

The light sensor unit 03 is configured to receive different light-reflection signals formed by the different light signals after the different light signals are reflected by the finger (the larger the light signal emitted by the light emitter unit 02, the larger the light-reflection signal received by the light sensor unit 03), to convert the different light-reflection signals into different electrical signals, and to output the different electrical signals to the fingerprint analyzer unit 04.

The fingerprint analyzer unit 04 is configured to determine the fingerprint information according to the different electrical signals received by the fingerprint analyzer unit 04.

For example, the fingerprint analyzer unit 04 is an integrated circuit (IC) or an electric circuit which is similar to the integrated circuit and configured to obtain the fingerprint information through processing the electrical signal outputted by the light sensor unit 03.

For example, the fingerprint analyzer unit obtains one fingerprint according to each of the electrical signals, and therefore obtains different fingerprints according to the different electrical signals. For example, the fingerprint analyzer unit determines the relationship between fingerprint data and at least one of a pressing strength and a pressing speed (that is, the pressing strength and/or the pressing speed) according to the different fingerprints obtained based on the different electrical signals, so as to generate the data of the fingerprint-pressing-habit of the user.

It should be understood that, in the embodiments of the present disclosure, the fingerprint information obtained by the fingerprint analyzer unit 04 may be the fingerprint, or the relationship between the fingerprint data and at least one of the pressing strength and the pressing speed, or the data of the fingerprint-pressing-habit of the user.

For example, in at least one embodiment, the light emitter unit 02 includes an organic light-emitting diode (OLED). In other embodiments of the present disclosure, for example, the light emitter unit 02 includes an inorganic light-emitting diode or other types of active light emitters.

An OLED display panel adopting the OLED (the organic light-emitting diode) has become the next generation display technology with great competitiveness and good development prospects because the OLED display panel has the advantages such as all solid-state structure, high brightness, wide view angle, fast response and being capable of realizing flexible display.

In an OLED array substrate of the OLED display panel, for example, one pixel unit includes three sub-pixel units, for example, one pixel unit includes a R (red) sub-pixel unit, a G (green) sub-pixel unit and a B (blue) sub-pixel unit, and each sub-pixel unit includes one OLED.

Figure 2:
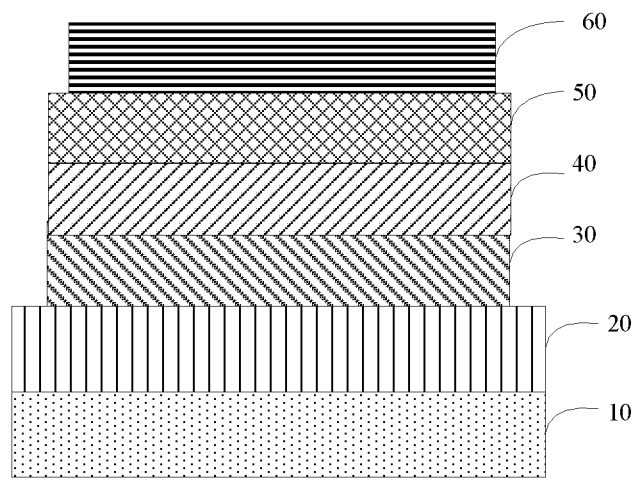
FIG. 2 is a schematic diagram of film structures of an organic light-emitting diode device in at least one embodiment of the present disclosure.

For example, as illustrated in FIG. 2, from bottom to top, the light emitter unit includes: an anode 20, a hole transport layer 30, an light-emitting layer 40 (for example, an organic light-emitting layer), an electron transport layer 50 and a cathode 60 which are sequentially on a substrate 10. For example, in other embodiments, the light emitter unit includes the anode 20, the light-emitting layer 40 and the cathode 60 which are sequentially on the substrate 10.

For example, the substrate 10 is a glass substrate, a quartz substrate, a plastic substrate or other types of transparent substrates. For example, a material of the anode 20 is indium tin oxide (ITO) or other transparent conductive materials. The hole transport layer (HTL) 30, the light-emitting layer (EML) 40 and the electron transport layer (ETL) 50 are between the anode 20 and the cathode 60. The light-emitting of the light-emitting layer 40 is realized through the current formed between the anode 20 and the cathode 60, and the current is generated by allowing a predetermined voltage difference to be generated between the anode 20 and the cathode 60.

For example, in the case where the light emitter unit 02 includes the OLED, the signal sent by the pressure detector unit 01 to the light emitter unit 02 is a current signal. Adopting of the current signal to control the light-emitting intensity of the OLED is in favor of realizing precise control of the light-emitting intensity of the OLED.

For example, in the embodiments of the present disclosure, the light emitter unit 02 includes one light emitter sub-unit or a plurality of light emitter sub-units, and each light emitter sub-unit includes an anode, a cathode and a light-emitting sub-layer between the anode and the cathode. For example, each light emitter sub-unit includes one OLED. For example, in the OLED display panel, each sub-pixel unit includes one light emitter sub-unit.

For example, in the case where the light emitter unit 02 includes the plurality of light emitter sub-units, the light-emitting layer 40 includes a plurality of light-emitting sub-layers, for example, the light-emitting layer 40 includes three light-emitting sub-layers of a R (red) light-emitting sub-layer, a G (green) light-emitting sub-layer and a B (blue) light-emitting sub-layer.

For example, in at least one embodiment, the light sensor unit 03 is a photo sensor. For example, the light sensor unit 03 includes a photodiode, for example, a PIN diode; alternatively, the light sensor unit 03 includes a phototransistor or a photo sensor of other type.

Figure 3:
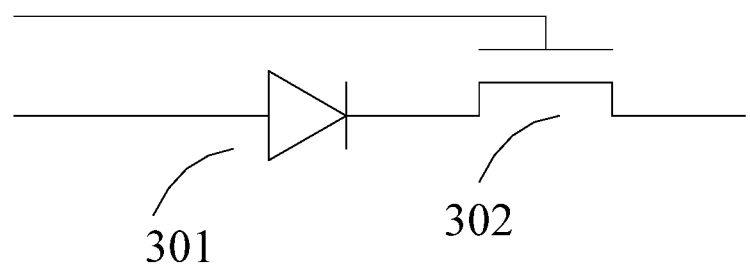
FIG. 3 is a schematic diagram of a light sensor unit in at least one embodiment of the present disclosure.

As illustrated in FIG. 3, in the structure of the light sensor unit (also referred to as a fingerprint sensor, for example) 03 based on a plurality of photo sensors, the turn-on and turn-off of each photo sensor 301 is controlled by one switch device 302, for example. For example, the photo sensor 301 is the photodiode, for example the PIN diode. For example, the switch device 302 is a thin film transistor (TFT).

In the case where the light sensor unit includes the plurality of photo sensors, the principle of the fingerprint recognition is described in the following. Because of the differences between the valleys and the ridges of the fingerprint of the finger, different light-reflection signals are formed at different positions of the finger after the light signal emitted by the light emitter unit 02 illuminates the finger, therefore differences occur between the intensities of light arrived at the plurality of photo sensors (for example, a plurality of photodiodes), and therefore differences occur between different light currents generated in the plurality of photo sensors. For example, the light sensor unit 03 includes a plurality of photo sensors arranged in an array with a plurality of rows and a plurality of columns. For the array structure formed by the plurality of photo sensors, detection of the valleys and the ridges of the fingerprint can be realized through controlling of the switch devices (for example, TFTs) of the photo sensors and sequentially reading the differences between the light currents of the photo sensors (for example, the photodiodes).

Figure 4:
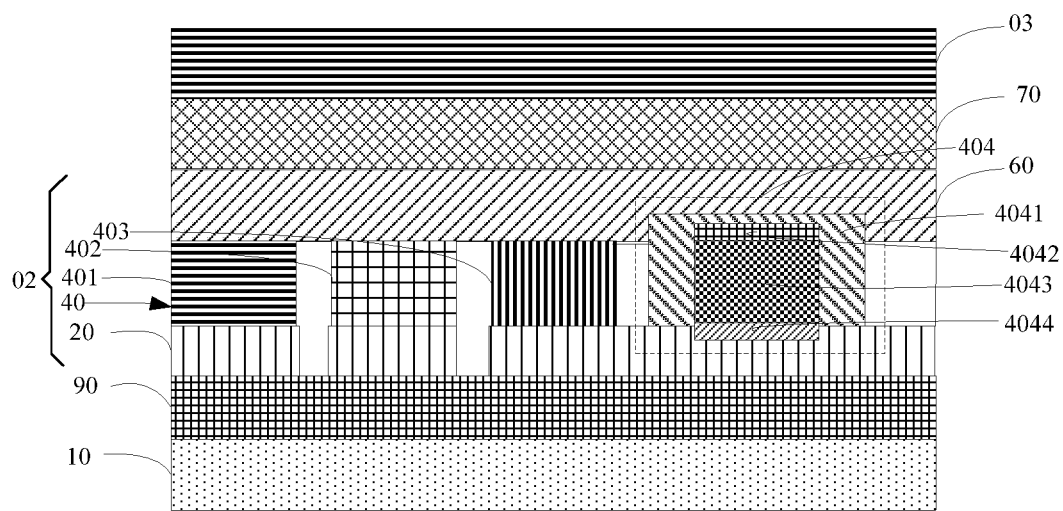
FIG. 4 is a schematic diagram of film structures of the fingerprint recognizer in at least one embodiment of the present disclosure.

For example, in at least one embodiment, the light sensor unit 03 is provided on an upper side of the light emitter unit (for example, the OLED) 02 (i.e., the light-exiting side of the light emitter unit 02). For example, both of the light sensor unit 03 and the light emitter unit 02 are on the same substrate (see the substrate 10 as illustrated in FIG. 4), the light emitter unit 02 is between the light sensor unit 03 and the substrate 10; in the case where the finger presses, the light sensor unit 03 is at the side of the light emitter unit 02 facing toward the finger.

For example, in at least one embodiment, the pressure detector unit 01 includes a piezoresistor and an operational amplifier. The piezoresistor includes a first electrode, a pressure sensitive material and a second electrode, the second electrode of the piezoresistor electrically connects the anode of the light emitter unit, and the first electrode of the piezoresistor is applied with a first voltage; an inverting input terminal of the operational amplifier connects the anode of the light emitter unit, a non-inverting input terminal of the operational amplifier is applied with a second voltage, and an output terminal of the operational amplifier connects the cathode of the light emitter unit; the first voltage is greater than the second voltage.

For example, the piezoresistor further includes an insulation layer, and the insulation layer, the first electrode, the pressure sensitive material and the second electrode are sequentially provided along an arrangement direction from the light sensor unit to the light emitter unit (i.e., sequentially provided from top to bottom).

For example, the pressure sensitive material of the piezoresistor is provided in the light-emitting layer of the light emitter unit. For example, the light emitter unit includes the plurality of light emitter sub-units arranged side by side, such that the light-emitting layer includes a plurality of light-emitting sub-layer patterns which are respectively corresponding to the plurality of light emitter sub-units, and in this case, the pressure sensitive material, for example, is provided between adjacent ones of the light-emitting sub-layer patterns.

The connections between the light emitter unit, the piezoresistor and the operational amplifier in the fingerprint recognizer provided by the embodiments of the present disclosure will be described in detail in the following with reference to FIG. 4 to FIG. 7.

For example, as illustrated in FIG. 4, the fingerprint recognizer provided by at least one embodiment of the present disclosure includes, sequentially and from bottom to top, the substrate (for example, the array substrate formed with a plurality of the switch devices arranged in an array) 10, a pixel unit driver circuit 90, a plurality of the anodes 20, the light-emitting layer 40, the cathode 60, a sealing layer 70 and the light sensor unit 03. In the embodiment as illustrated in FIG. 4, the light emitter unit 02 includes the plurality of light emitter sub-units (for example, three light emitter sub-units), the anodes 20 of the plurality of light emitter sub-units are spaced apart from each other, the light-emitting layer 40 includes the plurality of the light-emitting sub-layers (see the light-emitting sub-layers 401, 402, 403) respectively corresponding to the plurality of anodes 20, and the cathodes of the plurality of the light emitter sub-units are continuously connected with each other so as to obtain the cathode 60. For example, the plurality of the light-emitting sub-layers in the light-emitting layer 40 includes a first light-emitting sub-layer 401, a second light-emitting sub-layer 402 and a third light-emitting sub-layer 403. For example, the first light-emitting sub-layer 401, the second light-emitting sub-layer 402 and the third light-emitting sub-layer 403 are respectively the blue light-emitting sub-layer, the red light-emitting sub-layer and the green light-emitting sub-layer.

In the embodiment as illustrated in FIG. 4, the light sensor unit 03 is provided on an upper side of the sealing layer 70; in other embodiments, for example, the light sensor unit 03 is provided below the sealing layer 70.

In the case where the pixel unit driver circuit 90 is turned on to output a signal, the anode 20 of the light emitter sub-unit receives a driving signal from the pixel unit driver circuit 90, and the light emitter sub-unit is driven to emit light; in the case where the pixel unit driver circuit 90 is turned off to stop outputting the signal, the anode 20 of the light emitter sub-unit receives no driving signal, and the light emitter sub-unit emits no light. The cathodes of the light emitter sub-units 60 are connected with each other (for example, the cathodes of the light emitter sub-units 60 are directly and electrically connected with each other).

As illustrated in FIG. 4, the piezoresistor 404 is further provided in the light-emitting layer 40, for example, the piezoresistor 404 is provided in an opening at the periphery of the light-emitting sub-layer (see the light-emitting sub-layer 403) of the light-emitting layer 40. For example, the structure of the piezoresistor 404 includes, sequentially and from top to bottom, the insulation layer 4041, the first electrode 4042, the pressure sensitive material 4043 and the second electrode 4044. For example, the insulation layer 4041, the first electrode 4042, the pressure sensitive material 4043 and the second electrode 4044 which are included by the piezoresistor 404 are between the cathode 60 and a layer that is provided with the anode 20 of the light emitter unit 02. For example, a concave space is formed in the insulation layer 4041, an opening of the concave space faces toward the substrate 10, and the first electrode 4042 and the pressure sensitive material 4043 which are included in the piezoresistor 404 are provided in the concave space. For example, the insulation layer 4041 of the piezoresistor 404 is provided between the cathode 60 of the light emitter unit 02 and the first electrode 4042 of the piezoresistor 404. For example, the second electrode 4044 of the piezoresistor 404 and the anode 20 which electrically connects the second electrode 4044 are formed by the same film (i.e., being provided in the same layer and formed by the same material).

For example, the second electrode 4044 of the piezoresistor 404 connects the anode 20 of at least one light emitter sub-unit (for example, the second electrode 4044 of the piezoresistor 404 directly and electrically connects the anode 20 of at least one light emitter sub-unit), the pressure sensitive material 4043 of the piezoresistor 404 is provided in the light-emitting layer 40, and the pressure sensitive material 4043 of the piezoresistor 404 is adjacent to the light-emitting sub-layer (see numeral 403 in FIG. 4) of the light emitter sub-unit (i.e., no other light-emitting layer or no other pressure sensitive material is provided between the light-emitting sub-layer and the pressure sensitive material 4043), and the first electrode 4042 of the piezoresistor 404 is applied with the first voltage Vdd.

For example, the light-emitting sub-layer 403 which is adjacent to the pressure sensitive material 4043 is the green light-emitting sub-layer. In other embodiments, the pressure sensitive material 4043 is adjacent to the light-emitting sub-layer which emits light of other color.

Figure 5:
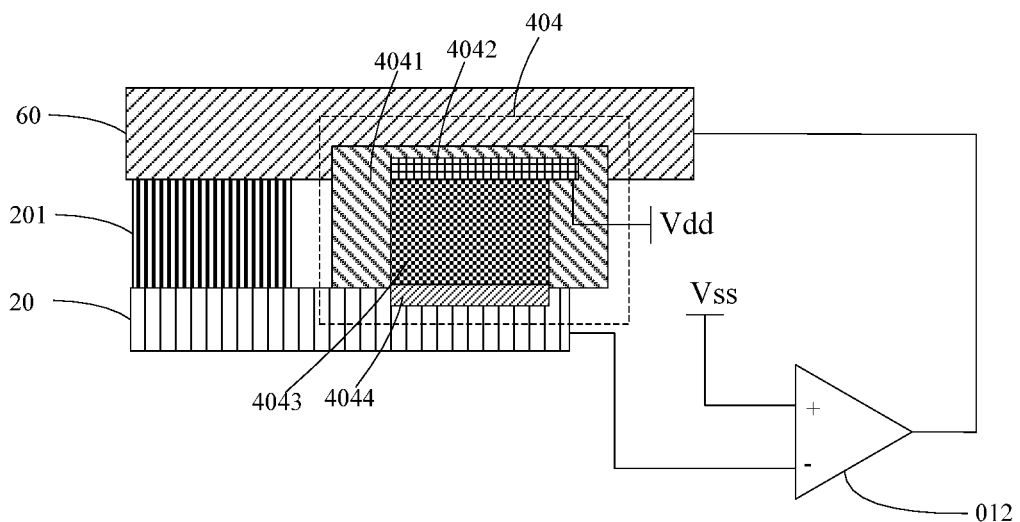
FIG. 5 is a schematic diagram illustrating an electrical connection between a pressure detector unit and a light emitter unit which are in the fingerprint recognizer in at least one embodiment of the present disclosure.

For example, in at least one embodiment, the connection between the piezoresistor 404 and the operational amplifier 012 may adopt the connection as illustrated in FIG. 5. For example, as illustrated in FIG. 5, the structure of the piezoresistor 404 includes, sequentially and from top to bottom, the insulation layer 4041, the first electrode 4042, the pressure sensitive material 4043 and the second electrode 4044. The layer on an upper side of the piezoresistor 404 is the cathode 60, and the second electrode 4044 of the piezoresistor connects the anode 20 of the light emitter sub-unit. For example, the anode 20 of the light emitter sub-unit 201 is the anode of a G (green) light emitter sub-unit. The first electrode 4042 of the piezoresistor 404 is applied with the first voltage Vdd. The inverting input terminal of the operational amplifier 012 connects the anode 20 of the light emitter sub-unit 201, the non-inverting input terminal of the operational amplifier 012 is applied with the second voltage Vss, and the output terminal of the operational amplifier 012 connects the cathode 60 of the light emitter sub-unit 201; the first voltage Vdd is greater than the second voltage Vss; and the cathode 60 is grounded.

Figure 7:
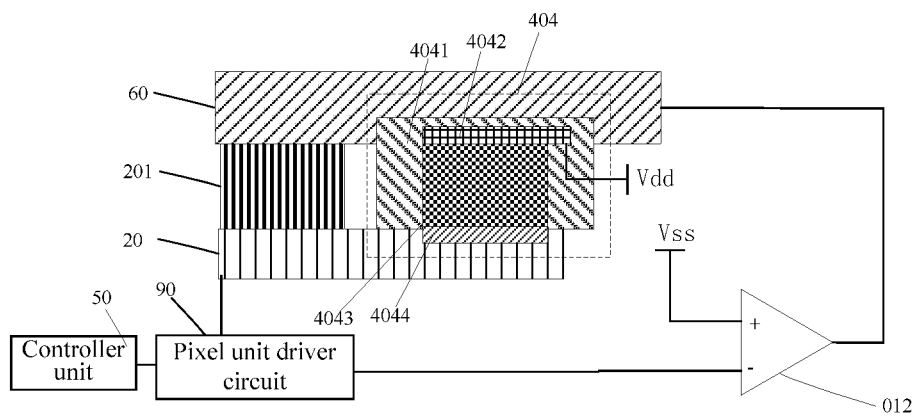
FIG. 7 is a schematic diagram illustrating electrical connections between the pressure detector unit, the light emitter unit, a driver circuit of a pixel unit and a controller unit in a fingerprint recognizer which are in the fingerprint recognizer provided by at least one embodiment of the present disclosure.

For example, in at least one embodiment, as illustrated in FIG. 7, the fingerprint recognizer further includes a controller unit 50, and the controller unit 50 is configured to stop driving signals from being outputted to the anodes of the light emitter sub-units before the fingerprint recognition. That is to say, during the process of performing the fingerprint recognition, the anodes of a plurality of light emitter sub-units in a region that is pressed by the finger are not applied with the driving signals, and the driving signals are configured to allow the plurality of light emitter sub-units to emit light with display information. For example, as illustrated in FIG. 7, the controller unit 50 electrically connects the pixel unit driver circuit 90, and the controller unit 50 is configured to control the pixel unit driver circuit 90 to stop outputting the driving signals.

For example, the controller unit 50 is an integrated circuit (IC) or an electric circuit which is similar to the integrated circuit and configured to control the pixel unit driver circuit.

Figure 6:
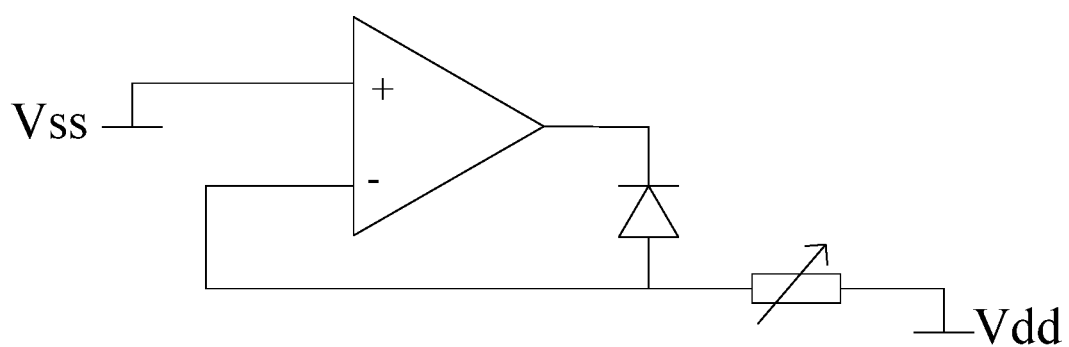
FIG. 6 is an equivalent circuit of the circuit as illustrated in FIG. 5, during a fingerprint recognition process.

In the structure as illustrated FIG. 7, in the case where the pixel unit driver circuit is turned on to output the signal, the light emitter sub-unit emits light normally. In the case where the pixel unit driver circuit is turned off to stop outputting the signal, the electrically connection relationship between the piezoresistor and the operational amplifier is illustrated in FIG. 6. In FIG. 6, the diode represents the light emitter sub-unit (for example, OLED). The following descriptions are provided by taking the case where the light emitter sub-unit is the OLED as an example. The OLED device is a current type light emitter device, a current passing through the light emitter sub-unit is equal to a current passing through the piezoresistor, that is, the current I passing through the light emitter sub-unit satisfy $I=(Vdd-Vss)/R$; in which R represents a resistance of the piezoresistor, Vdd is the first voltage, Vss is the second voltage, and the first voltage (Vdd) is greater than the second voltage (Vss). The greater the pressing strength applied onto the piezoresistor, the smaller the resistance of the piezoresistor, and therefore, the larger the current passing through the piezoresistor, that is, the larger the current passing through the OLED light emitter sub-unit, and the larger the light-emitting intensity. Therefore, the light-emitting intensity of the light emitter sub-unit is in proportion to the pressing strength of the finger (the strength at which the finger presses).

In at least one embodiment, the pressing strength and the pressing speed of the finger are determined according to the light intensity sensed by the light sensor unit, and therefore, the fingerprint-pressing-habit of the user is obtained. Therefore, for example, the learned fingerprint-pressing-habit of the user is a subsidiary basis in the fingerprint recognition, and thus the reliability of the fingerprint recognition is improved.

Figure 8:
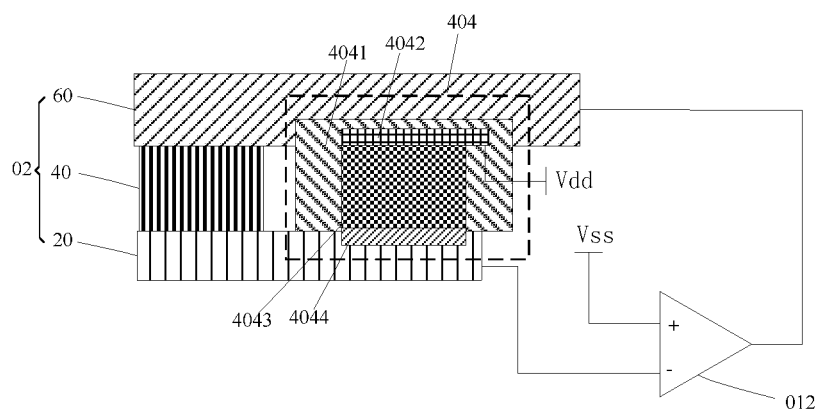
FIG. 8 is a schematic diagram of a light emitter device provided by at least one embodiment of the present disclosure.

At least one embodiment of the present disclosure further provides a light emitter device, as illustrated in FIG. 8, the light emitter device includes the light emitter unit 02 and the piezoresistor 404. The light emitter unit 02 includes the anode 20, the cathode 60 and the light-emitting layer 40 between the anode 20 and the cathode 60; the piezoresistor 404 includes the first electrode 4042, the second electrode 4044, and the pressure sensitive material 4043 which is between the first electrode 4042 and the second electrode 4044; the second electrode 4044 of the piezoresistor 404 electrically connects the anode 20 of the light emitter unit 02, and the current passing through the light emitter unit 02 is under control of the current passing through the piezoresistor 404. For example, the current passing through the light emitter unit 02 is approximately equal to the current passing through the piezoresistor 404.

For example, the piezoresistor 404 further includes the the insulation layer 4041, which is between the first electrode 4042 of the piezoresistor 404 and the cathode 60 of the light emitter unit 02.

For example, as illustrated in FIG. 8, the light emitter device provided by at least one embodiment of the present disclosure further includes the operational amplifier 012, and the operational amplifier 012 includes the inverting input terminal, the non-inverting input terminal and the output terminal; the inverting input terminal of the operational amplifier 012 electrically connects the second electrode 4044 of the piezoresistor 404 and the anode 20 of the light emitter unit 02, the output terminal of the operational amplifier 012 electrically connects the cathode 60 of the light emitter unit 02; the voltage Vss applied to the non-inverting input terminal of the operational amplifier is smaller than the voltage Vdd applied to the first electrode 4042 of the piezoresistor 404.

In the light emitter device provided by the embodiments of the present disclosure, for example, the light-emitting intensity of the light emitter unit 02 is under control of the piezoresistor 404. For example, the light-emitting intensity of the light emitter unit 02 is correspondingly changed in the situation where the pressing strength applied onto the piezoresistor 404 is changed.

Figure 9:
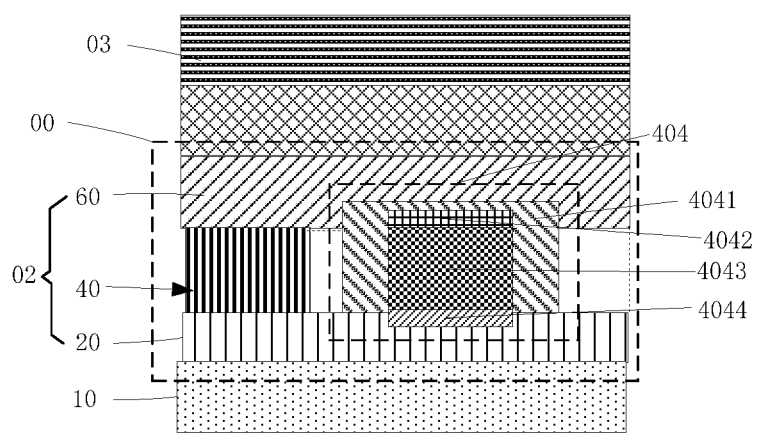
FIG. 9 is a schematic diagram of an optical sensor provided by at least one embodiment of the present disclosure.

At least one embodiment of the present disclosure further provides an optical sensor, as illustrated in FIG. 9, the optical sensor includes the light emitter device 00 provided by any one of the above-mentioned embodiments, and the light emitter device 00 is configured to emit the light signal; the optical sensor further includes the light sensor unit 03 which is configured to detect the light-reflection signal formed by reflection of the light signal emitted by the light emitter device 00.

At least one embodiment of the present disclosure provides a display device, which includes the fingerprint recognizer, the light emitter device or the optical sensor, provided by any one of the above-mentioned embodiments.

For example, the display device may be any product or device that has a display function, such as an OLED (organic light-emitting diode) panel, a cell phone, a tablet computer, a television, a display, a laptop, a digital photo frame and a navigator.

At least one embodiment of the present disclosure further provides a fingerprint recognition method, which includes: by the pressure detector unit, detecting the strength at which the finger presses the display screen, and sending the signal to the light emitter unit according to the strength; by the light emitter unit, emitting the light signal under control of the signal; by the light sensor unit, receiving the light-reflection signal formed by the light signal reflected by the finger, converting the light-reflection signal into the electrical signal, and outputting the electrical signal to the fingerprint analyzer unit; by the fingerprint analyzer unit, determining the fingerprint information according to the electrical signal received by the fingerprint analyzer unit.

Figure 10:
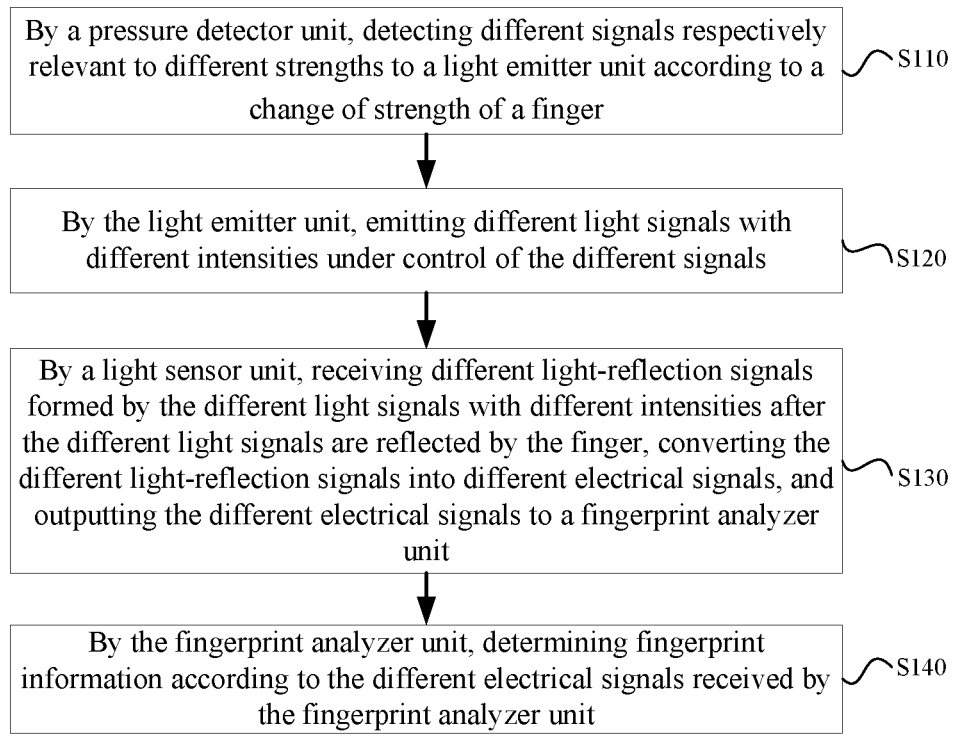
FIG. 10 is a flow chart of a fingerprint recognition method in at least one embodiment of the present disclosure.

For example, as illustrated in FIG. 10, at least one embodiment of the present disclosure provides a fingerprint recognition method, and the fingerprint recognition method includes the following step S110 to step S140.

Step S110, by the pressure detector unit, detecting the strength at which the finger presses the display screen, and sending the different signals respectively relevant to the different strengths to the light emitter unit according to the change of the strength.

Step S120, by the light emitter unit, emitting the different light signals with different intensities under control of the different signals.

Step S130, by the light sensor unit, receiving the different light-reflection signals formed by the different light signals with the different intensities after the different light signals are reflected by the finger, converting the different light-reflection signals into the different electrical signals, and outputting the different electrical signals to the fingerprint analyzer unit.

Step S140, by the fingerprint analyzer unit, obtaining the fingerprint information according to the different electrical signals received by the fingerprint analyzer unit.

For example, in at least one embodiment, the fingerprint recognition method further includes: by the fingerprint analyzer unit, obtaining the relationship between the fingerprint data and at least one of the pressing strength and the pressing speed, and generating the data of the fingerprint-pressing-habit of the user; recognizing the fingerprint by referring to the fingerprint-pressing-habit of the user during the fingerprint recognition.

The above-mentioned embodiments of the fingerprint recognizer, the fingerprint recognition method, the light emitter device, the optical sensor and the display device can be cross-referenced. In case of no conflict, the embodiments of the present application can be combined and features in the embodiments can be combined.

What are described above is related to the illustrative embodiments of the disclosure only and not limitative to the scope of the disclosure; the scopes of the disclosure are defined by the accompanying claims.

What is claimed is:

1. A fingerprint recognizer, comprising a pressure detector circuit, a light emitter unit, a light sensor unit and a fingerprint analyzer circuit, wherein
   the pressure detector circuit is configured to detect a strength at which a finger presses a display screen of the fingerprint recognizer, and to send a signal to the light emitter unit according to the strength;
   the light emitter unit comprising a light-emitting diode is configured to emit a light signal according to the signal;
   the light sensor unit comprising a plurality of photo sensors is configured to receive a light-reflection signal formed by the light signal reflected by the finger, to convert the light-reflection signal into an electrical signal, and to output the electrical signal to the fingerprint analyzer circuit; and
   the fingerprint analyzer circuit is configured to determine fingerprint information according to the electrical signal received by the fingerprint analyzer circuit.

2. The fingerprint recognizer according to claim 1, wherein
   the pressure detector circuit is configured to sequentially send different signals respectively relevant to different strengths to the light emitter unit according to a change of the strength;
   the light emitter unit is configured to emit different light signals according to the different signals;
   the light sensor unit is configured to receive different light-reflection signals formed by the different light signals reflected by the finger, to convert the different light-reflection signals into different electrical signals, and to output the different electrical signals to the fingerprint analyzer circuit; and the fingerprint analyzer circuit is configured to determine the fingerprint information according to the different electrical signals received by the fingerprint analyzer circuit.

3. The fingerprint recognizer according to claim 2, wherein the light emitter unit comprises an organic light-emitting diode.

4. The fingerprint recognizer according to claim 3, wherein the signal, which is sent by the pressure detector circuit to the light emitter unit, is a current signal.

5. The fingerprint recognizer according to claim 2, wherein
the light emitter unit comprises an anode, a light-emitting layer and a cathode;
the pressure detector circuit comprises a piezoresistor and an operational amplifier;
the piezoresistor comprises a first electrode, a pressure sensitive material and a second electrode, the second electrode of the piezoresistor electrically connects the anode of the light emitter unit, and the first electrode of the piezoresistor is applied with a first voltage;
an inverting input terminal of the operational amplifier connects the anode of the light emitter unit, a non-inverting input terminal of the operational amplifier is applied with a second voltage, and an output terminal of the operational amplifier connects the cathode of the light emitter unit; and
the first voltage is greater than the second voltage.

6. The fingerprint recognizer according to claim 1, wherein the light emitter unit comprises an organic light-emitting diode.

7. The fingerprint recognizer according to claim 6, wherein the signal, which is sent by the pressure detector circuit to the light emitter unit, is a current signal.

8. The fingerprint recognizer according to claim 1, wherein
the light emitter unit comprises an anode, a light-emitting layer and a cathode;
the pressure detector circuit comprises a piezoresistor and an operational amplifier;
the piezoresistor comprises a first electrode, a pressure sensitive material and a second electrode, the second electrode of the piezoresistor electrically connects the anode of the light emitter unit, and the first electrode of the piezoresistor is applied with a first voltage;
an inverting input terminal of the operational amplifier connects the anode of the light emitter unit, a non-inverting input terminal of the operational amplifier is applied with a second voltage, and an output terminal of the operational amplifier connects the cathode of the light emitter unit; and
the first voltage is greater than the second voltage.

9. The fingerprint recognizer according to claim 8, wherein the piezoresistor further comprises an insulation layer, and the insulation layer, the first electrode, the pressure sensitive material and the second electrode are sequentially provided along an arrangement direction from the light sensor unit to the light emitter unit.

10. The fingerprint recognizer according to claim 8, wherein the pressure sensitive material of the piezoresistor is in the light-emitting layer of the light emitter unit.

11. The fingerprint recognizer according to claim 8, further comprising a controller unit, wherein the controller unit is configured to stop a driving signal from being outputted to the anode of the light emitter unit before fingerprint recognition is performed.

12. The fingerprint recognizer according to claim 1, wherein the light sensor unit comprises a photodiode or a phototransistor.

13. The fingerprint recognizer according to claim 1, wherein the light sensor unit is at a light-exiting side of the light emitter unit.

14. A fingerprint recognition method, comprising:
by a pressure detector circuit, detecting a strength at which a finger presses a display screen and sending a signal to a light emitter unit according to the strength;
by a light emitter unit, emitting a light signal according to the signal;
by a light sensor unit, receiving a light-reflection signal formed by the light signal reflected by the finger, converting the light-reflection signal into an electrical signal, and outputting the electrical signal to a fingerprint analyzer circuit; and
by the fingerprint analyzer circuit, determining fingerprint information according to the electrical signal received by the fingerprint analyzer circuit.

15. The fingerprint recognition method according to claim 14, wherein
the pressure detector circuit sequentially sends different signals respectively relevant to different strengths to the light emitter unit according to a change of the strength;
the light emitter unit emits different light signals according to the different signals;
the light sensor unit receives different light-reflection signals formed by the different light signals reflected by the finger, converts the different light-reflection signals into different electrical signals, and outputs the different electrical signals to the fingerprint analyzer circuit; and
the fingerprint analyzer circuit determines the fingerprint information according to the different electrical signals received by the fingerprint analyzer circuit.

16. The fingerprint recognition method according to claim 14, further comprising:
by the fingerprint analyzer circuit, obtaining a relationship between fingerprint data and at least one of a pressing strength and a pressing speed and generating data of a fingerprint-pressing-habit of a user; and
recognizing a fingerprint by referring to the fingerprint-pressing-habit of the user during fingerprint recognition.

17. A display device, comprising a fingerprint recognizer, wherein the fingerprint recognizer comprises a pressure detector circuit, a light emitter unit, a light sensor unit and a fingerprint analyzer circuit, wherein
the pressure detector circuit is configured to detect a strength at which a finger presses a display screen of the fingerprint recognizer, and to send a signal to the light emitter unit according to the strength;
the light emitter unit comprising a light-emitting diode is configured to emit a light signal according to the signal;
the light sensor unit comprising a plurality of photo sensors is configured to receive a light-reflection signal formed by the light signal reflected by the finger, to convert the light-reflection signal into an electrical signal, and to output the electrical signal to the fingerprint analyzer circuit; and
the fingerprint analyzer circuit is configured to determine fingerprint information according to the electrical signal received by the fingerprint analyzer circuit.

* * * * *